United States Patent
Wu

(10) Patent No.: US 11,798,636 B2
(45) Date of Patent: Oct. 24, 2023

(54) POWER SUPPLY FOR A MEMORY DEVICE

(71) Applicant: Micron Technology, Inc., Boise, ID (US)

(72) Inventor: Minjian Wu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 258 days.

(21) Appl. No.: 17/287,444

(22) PCT Filed: Oct. 9, 2020

(86) PCT No.: PCT/CN2020/119908
§ 371 (c)(1),
(2) Date: Apr. 21, 2021

(87) PCT Pub. No.: WO2022/073177
PCT Pub. Date: Apr. 14, 2022

(65) Prior Publication Data
US 2023/0139638 A1  May 4, 2023

(51) Int. Cl.
*G11C 7/00* (2006.01)
*G11C 16/34* (2006.01)
*G11C 16/30* (2006.01)

(52) U.S. Cl.
CPC .......... *G11C 16/3404* (2013.01); *G11C 16/30* (2013.01)

(58) Field of Classification Search
CPC ....... G11C 5/147; G11C 5/14; G11C 11/4074; G11C 16/30; G11C 5/143
(Continued)

(56) References Cited

U.S. PATENT DOCUMENTS

| | | | | |
|---|---|---|---|---|
| 5,818,781 A | * | 10/1998 | Estakhri | G06K 19/07 365/189.09 |
| 9,190,120 B2 | * | 11/2015 | Shim | G11C 16/30 |

(Continued)

FOREIGN PATENT DOCUMENTS

| CN | 1202255 A | 12/1998 |
|---|---|---|
| CN | 1637925 A | 7/2005 |
| CN | 108028068 B | 6/2021 |

OTHER PUBLICATIONS

ISA/CN, "International Search Report and Written Opinion of the International Searching Authority," issued in connection with Int'l Appl. No. PCT/CN2020/119908, dated Jun. 24, 2021 (9 pages).

*Primary Examiner* — Son T Dinh
(74) *Attorney, Agent, or Firm* — Holland & Hart LLP

(57) ABSTRACT

Methods, systems, and devices for an improved power supply for a memory device are described. An apparatus may include a memory device, one or more voltage detectors, and one or more voltage converters. A voltage detector may generate an output indicating whether a voltage at a first pin of the apparatus satisfies a threshold. A voltage converter may be coupled with the voltage detector and may be configured to selectively output a second voltage depending on the output of the voltage detector. Circuitry within the memory device may be coupled with one or more voltage detectors and one or more voltage converters and configured to select a supply voltage for another component of the memory device from among the first voltage (e.g., received from the first pin) and the second voltage (e.g., selectively generated and output by the voltage converter) based on the output from the voltage detector.

24 Claims, 5 Drawing Sheets

(58) Field of Classification Search
USPC .................................................. 365/226, 227
See application file for complete search history.

(56) References Cited

U.S. PATENT DOCUMENTS

2011/0228622 A1   9/2011  Coteus et al.
2015/0130533 A1*  5/2015  Jeon ..................... G11C 5/147
                                              327/540

* cited by examiner

POWER SUPPLY FOR A MEMORY DEVICE

CROSS REFERENCE

The present Application for Patent is a 371 national phase filing of International Application No. PCT/CN2020/119908, by WU, entitled "IMPROVED POWER SUPPLY FOR A MEMORY DEVICE," filed Oct. 9, 2020, assigned to the assignee hereof, and is expressly incorporated by reference in its entirety herein.

BACKGROUND

The following relates generally to one or more systems for memory and more specifically to improved power supply for a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A memory system may operate using one or more different supply voltages (e.g., supply voltages having different output voltages). For example, a controller of the memory system may receive a first supply voltage and a memory device of the memory system may receive a second supply voltage different from the first supply voltage. Additionally, different types of memory systems may be configured to operate using different sets of supply voltages. For example, a first type of memory system (e.g., a Type 1 Universal Flash Storage (UFS) memory system) may be configured to operate using a different set of supply voltages than a second type of memory system (e.g., a Type 2 UFS memory system). The memory system may receive the one or more supply voltages from a host system (e.g., via one or more pins of the memory system).

Some host systems (e.g., printed circuit boards (PCBs) configured to accommodate a memory system and associated host device) may be configured to provide supply voltages compatible with some memory systems but not other memory systems, which may introduce compatibility and flexibility constrains, among other possible disadvantages. For instance, continuing the above example, a host system may provide supply voltages compatible with Type 1 UFS memory systems, but not Type 2 UFS memory systems, or vice versa.

As described herein, a memory system may autonomously detect whether one or more supply voltages are provided by (e.g., available to, coupled with) the memory system. The memory system may further include any quantity of voltage converters (e.g., voltage regulators). Based on the detected externally provided supply voltages, the memory system may selectively enable or disable one or more of the voltage converters, and in some cases directly utilize one or more of the externally provided supply voltages, in order to obtain appropriate voltages for operating one or more components of the memory system. Thus, the memory system may be able to be utilized as part of a host system configured to accommodate the memory system, or alternatively as part of a host system configured to accommodate a different type of memory system. For instance, and again continuing the above example, a Type 2 UFS memory system may be used as part of a system designed to include a Type 1 UFS memory system, or vice versa. Thus, a given memory system may beneficially be compatible with and usable as part of a wider range of systems, among other possible advantages.

Features of the disclosure are initially described in the context of a system as described with reference to FIGS. 1 and 2. Features of the disclosure are described in the context of circuit diagrams as described with reference to FIGS. 3-5.

Figure 1:
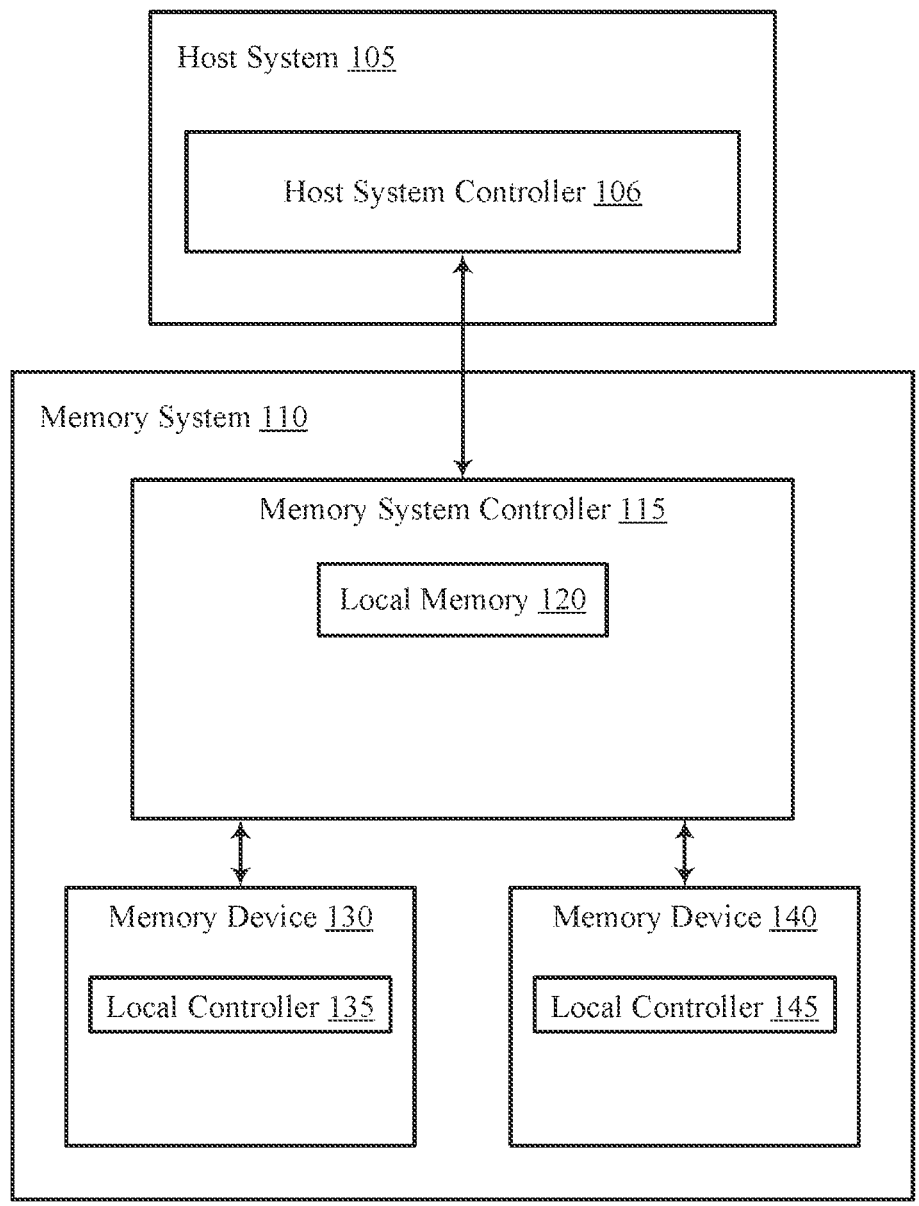
FIGS. 1 and 2 illustrate examples of systems that support improved power supply for a memory device in accordance with examples as disclosed herein.

FIG. 1 illustrates an example of a system 100 that supports an improved power supply for a memory device in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a UFS device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, serial advanced technology attachment (SATA) controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open Not And Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110. The host system 105 may additionally supply a set of voltages to the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface). The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include Not And (NAND) (e.g., NAND flash) memory, ROM, phase change memory (PCM), self-selecting memory, other chalcogenide-based memories, ferroelectric RAM (FeRAM), magneto RAM (MRAM), Not Or (NOR) (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

The memory system 110 may be configured to operate using a defined set of supply voltages. For example, the memory system controller 115 may be configured to operate using a first supply voltage, while the memory device 130 or the memory device 140 may be configured to operate using a different supply voltage. Additionally or alternatively, a memory array within the memory device 130 or memory device 140 may be configured to operate using a different supply voltage than one or more other components of the memory device 130 or memory device 140, such as a local controller 135 or local controller 145 within the memory device 130 or memory device 140, or an interface within the memory device 130 or memory device 140 for communicating with the memory system controller 115. Additionally or alternatively, logic circuitry within the memory system controller 115 may be configured to operate using a different supply voltage than one or more other components of the memory system controller 115, such as an interface within the memory system controller 115 for communicating with the host system 105 (e.g., host system controller 106), memory device 130, or memory device 140.

In some cases, different memory systems 110 may be configured to operate using different supply voltages. For example, a first type of memory system 110 (e.g., a Type 1 UFS system) may be configured to operate using a different set of supply voltages than a second type of memory system 110 (e.g., a Type 2 UFS system). The memory system 110 may receive the one or more supply voltages from the system 100 (e.g., via one or more pins of the memory system 110). In some cases, a system 100 may supply a set of supply voltages that the memory system 110 is configured to use. In some other cases, a system 100 may supply a set of supply voltages that are different from the supply voltages that the memory system 110 is configured to use.

The memory system 110 may autonomously detect the supply voltages provided by the system 100 (e.g., whether one or more such supply voltage is the same or different as a supply voltage that the memory system 110 is configured to use). In a case that the memory system 110 detects that a supply voltage from the system 100 is the same as a supply voltage the memory system 110 is configured to use, the memory system 110 may propagate the supply voltage received from system 100 to one or more components (e.g., the memory devices 130 and 140, the memory system controller 115, or a component thereof) of the memory system 110 configured to use that supply voltage. In a case that the memory system 110 detects that a supply voltage from the system 100 is different than a supply voltage the memory system 110 is configured to use, the memory system 110 may adjust (e.g., convert) the supply voltage received from the system 100 to generate a supply voltage that the memory system 110 is configured to use. Then, the memory system 110 may supply the adjusted supply voltage to one or more various components of the memory system 110. Thus, the memory system 110 may be configured to operate when included in a system 100 that provides supply voltages that are the same as those the memory system 110 is configured to use, and also when included in a system 100 that provides different supply voltages.

The system 100 may include any quantity of non-transitory computer readable media that support improved power supply for a memory device. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform associated functions as described herein.

Figure 2:
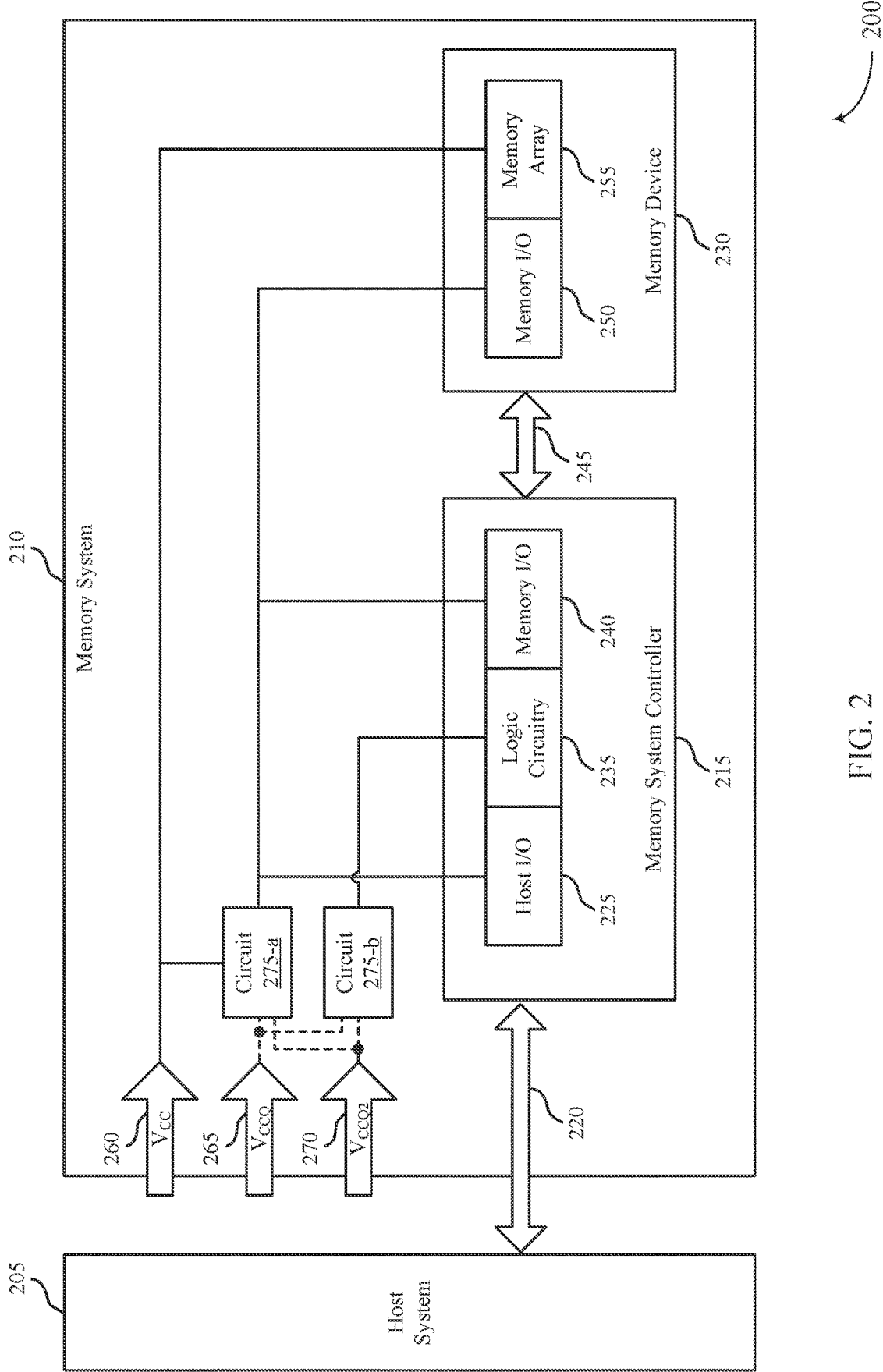

FIG. 2 illustrates an example of a system 200 that supports an improved power supply for a memory device in accordance with examples as disclosed herein. In some cases, the system 200 may include aspects of the system 100 as descried with reference to FIG. 1. For example, the host system 205 may be an example of the host system 105, memory system 210 may be an example of memory system 110, memory system controller 215 may be an example of the memory system controller 115 (e.g., a managed NAND (mNAND) controller), and memory device 230 may be an example of the memory device 130 or the memory device 140. The system 200 may additionally include supply voltages 260, 265, and 270 as well as circuits 275-a and 275-b.

The memory system 210 may be in communication with the host system 205 via communication link 220. In some cases, the communication link 220 may be a UFS communication link. Here, the host system 205 and the memory system 210 may communicate via a UFS interface. The memory system 210 may include a memory system controller 215 and a memory device 230.

The memory system controller 215 may include a host I/O 225, logic circuitry 235, and memory I/O 240. The host V/O 225 may communicate data, control information (e.g., commands), or other signaling between the host system 205 and the memory system 210 via the communication link 220. The memory I/O 240 may communicate data, control information (e.g., commands), or other signaling between the memory system controller 215 and the memory device 230.

The memory device 230 may include a memory I/O 250 and an memory array 255. The memory I/O 250 may communicate, via the communication link 245, data, control information (e.g., commands), or other signaling between the memory array 255 and the memory system controller 215. The memory array 255 may include any quantity of memory cells, which may store information (e.g., information used by the host system 205).

The host system 205 may supply one or more voltages to the memory system 210. For example, the host system 205 may supply voltage 260 (e.g., $V_{CC}$) via a first pin at the memory system. Additionally, the host system 205 may supply either the voltage 265 (e.g., $V_{CCQ}$) or the voltage 270 (e.g., $V_{CCQ2}$) via a second pin at the memory system. The voltage 260 may be a relatively large voltage (e.g., compared to the voltages 265 and 270) and the memory system 210 may direct the voltage 260 to the memory array 255 of the memory device 230. Either the voltage 265 or the voltage 270 may be used by the memory system 210 to supply voltages to the host I/O 225, the logic circuitry 235, the memory I/O 240, and the memory I/O 250.

In some cases, the host I/O 225, the memory i/O 240, and the memory i/O 250 of the memory system 210 may be configured to use either the voltage 265 or the voltage 270. For example, a first type of memory system 210 may be configured to use voltage 270 while a second type of memory system 210 may be configured to use voltage 265. Additionally, the host system 205 may supply either the voltage 265 or the voltage 270 and may supply a voltage 265 or 270 that is different from the voltage 265 or 270 used by various components within the memory system 210. The memory system 210 may utilize circuit 275-a to autonomously detect which voltage (e.g., from among voltage 265 and voltage 270) is supplied to the memory system 210. Additionally, circuit 275-a may supply a correct voltage to the host I/O 225, the memory I/O 240, and the memory I/O 250 based on receiving the voltage 265 or the voltage 270 from the pin of the memory system 210.

For example, if the host I/O 225, the memory I/O 240, and the memory I/O 250 are configured to use voltage 265, the circuit 275-a may receive either the voltage 265 or the voltage 270 from the host system 205 and may generate a voltage 265 to supply to the host I/O 225, the memory I/O 240, and the memory I/O 250. In another example where the host I/O 225, the memory I/O 240, and the memory I/O 250 are configured to use the voltage 270, the circuit 275-a may receive either the voltage 265 or the voltage 270 from the host system 205 and may generate a voltage 270 to supply to the host I/O 225, the memory I/O 240, and the memory I/O 250.

In some cases, the logic circuitry 235 may be configured to use a lower voltage (e.g., than the voltage 260, 265, or 270). Thus, the circuit 275-b may adjust either voltage 265 or voltage 270 to generate the supply voltage for the logic circuitry 235.

Figure 3:
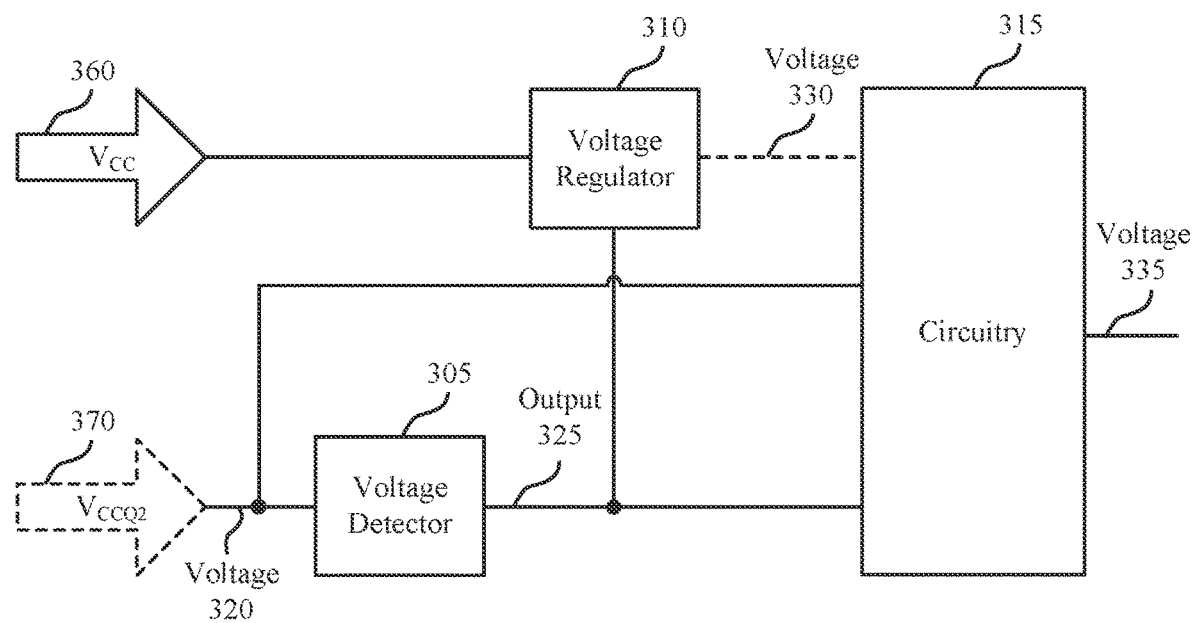
FIGS. 3 through 5 illustrate examples of circuits that support improved power supply for a memory device in accordance with examples as disclosed herein.

FIG. 3 illustrates an example of a circuit 300 that supports an improved power supply for a memory device in accordance with examples as disclosed herein. In some cases, the circuit 300 may include aspects of the circuit 275-a as described with reference to FIG. 2. For example, the voltage 360 may be an example of the voltage 260, and the voltage 370 may be an example of the voltage 270. Additionally, the circuit 300 may illustrate an output voltage 335, which may be supplied to a host I/O 225, a memory I/O 240, and a memory I/O 250 as described with reference to FIG. 2. The circuit 300 may additionally include a voltage detector 305, a voltage regulator 310, and circuitry 315.

A memory system (e.g., as described with reference to FIGS. 1 and 2) may include circuit 300 in a case that memory system is configured to use a supply voltage equivalent to the voltage 370 (e.g., a $V_{CCQ2}$ voltage, 1.8V). That is, the circuitry 315 may output a voltage 335 to components of the memory system (e.g., a host I/O, memory I/Os) that is equivalent to the voltage 370. The circuit 300 may output the voltage 335 that is equivalent to the voltage 370 in a case where the host system supplies the voltage 370 to the memory system and in a case where the host system does not supply the voltage 370 to the memory system (e.g., when the host system instead supplies a different voltage such as a $V_{CCQ}$ voltage or a 1.2V voltage).

The circuit 300 may include a voltage detector 305 coupled with a pin that is configured to receive the voltage 370 (e.g., from a host system). The voltage detector 305 may detect whether the voltage 320 of the pin exceeds a threshold. For example, the voltage detector 305 may compare a voltage 320 of the pin to a threshold voltage that is less than the voltage 370. In a case that the host system does not supply the voltage 370 to the memory system, the voltage detector 305 may determine that the voltage 320 of the pin is less than the threshold and may generate an output 325 indicating that the voltage 320 is less than the threshold. For example, the voltage detector 305 may output a low signal indicating that the voltage 320 is less than the threshold. In another case where the host system does supply the voltage 370 to the memory system, the voltage detector 305 may determine that the voltage 320 of the pin is greater than the threshold and may generate an output 325 indicating that the voltage 320 is greater than the threshold. For example, the voltage detector 305 may output a high signal indicating that the voltage 320 is greater than the threshold.

The voltage regulator 310 may be configured to selectively output a voltage 330 to the circuitry 315. For example, when the voltage regulator 310 is enabled, the voltage regulator 310 may adjust the voltage 360 to generate the voltage 330. For example, the voltage 360 may be 2.5V or 3.3V and the voltage regulator 310 may adjust the voltage 360 to output the voltage 330 of 1.8V. In another example when the voltage regulator 310 is not enabled, the voltage regulator 310 may not output the voltage 330 to the circuitry 315. In some cases, the voltage regulator 310 may be a low-dropout regulator.

The voltage regulator 310 may be enabled or disabled based on the output 325. For example, when the output 325 indicates that the voltage 320 is less than the threshold, the voltage regulator 310 may be enabled to output the voltage 330 to the circuitry 315. In another example, when the output 325 indicates that the voltage 320 is greater than the threshold, the voltage regulator 310 may not be enabled and may not output any voltage to the circuitry 315. Thus, when the voltage 370 is supplied to a memory system, the voltage regulator 310 may be disabled which may conserve power at the memory system.

The circuitry 315 may be configured to select, from the voltage 330 and the voltage 320, a voltage 335 to output to components of the memory system. The circuitry 315 may select the voltage 330 or the voltage 320 based on the output 325. For example, if the output 325 indicates that the voltage 320 fails to satisfy the threshold (e.g., the voltage 370 is not supplied to the memory system), the circuitry 315 may select the voltage 330. In another example, if the output 325 indicates that the voltage 320 satisfies the threshold (e.g., the voltage 370 is supplied to the memory system), the circuitry 315 may select the voltage 320. Thus, the circuitry 315 may output the voltage 335 based on whether the voltage 320 satisfies the threshold.

Figure 4:
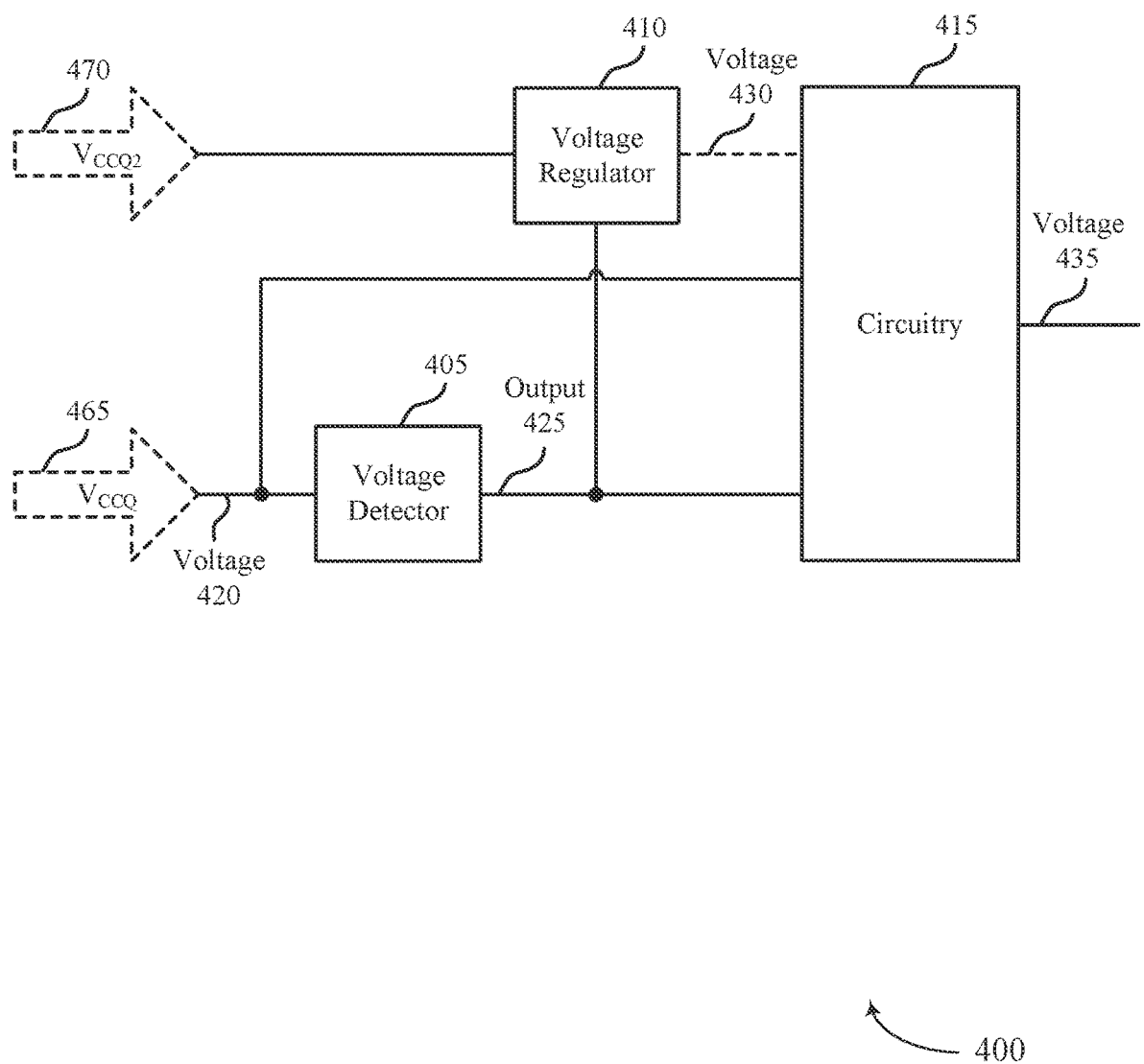

FIG. 4 illustrates an example of a circuit 400 that supports an improved power supply for a memory device in accordance with examples as disclosed herein. In some cases, the circuit 400 may include aspects of the circuit 275-a as described with reference to FIG. 2. For example, the voltage 470 may be an example of the voltage 270, and the voltage 465 may be an example of the voltage 265. Additionally, the circuit 400 may illustrate an output voltage 435, which may be supplied to a host i/O 225, a memory i/O 240, and a memory I/O 250 as described with reference to FIG. 2. The circuit 400 may additionally include a voltage detector 405, a voltage regulator 410, and circuitry 415.

A memory system (e.g., as described with reference to FIGS. 1 and 2) may include circuit 400 in a case that memory system is configured to use a supply voltage equivalent to the voltage 465 (e.g., a $V_{CCQ}$ voltage, 1.2V). That is, the circuitry 415 may output a voltage 435 to components of the memory system (e.g., a host I/O, memory I/Os) that is equivalent to the voltage 465. The circuit 400 may output the voltage 435 that is equivalent to the voltage 465 in a case where the host system supplies the voltage 465 to the memory system and in a case where the host system does not supply the voltage 465 to the memory system (e.g., when the host system instead supplies a different voltage such as a $V_{CCQ2}$ voltage or a 1.8V voltage).

The circuit 400 may include a voltage detector 405 coupled with a pin that is configured to receive the voltage 465 (e.g., from a host system). The voltage detector 405 may detect whether the voltage 420 of the pin exceeds a threshold. For example, the voltage detector 405 may compare a voltage 420 of the pin to a threshold voltage that is less than the voltage 465. In a case that the host system does not supply the voltage 465 to the memory system, the voltage detector 405 may determine that the voltage 420 of the pin is less than the threshold and may generate an output 425 indicating that the voltage 420 is less than the threshold. For example, the voltage detector 405 may output a low signal indicating that the voltage 420 is less than the threshold. In another case where the host system does supply the voltage 465 to the memory system, the voltage detector 405 may determine that the voltage 420 of the pin is greater than the threshold and may generate an output 425 indicating that the voltage 420 is greater than the threshold. For example, the voltage detector 405 may output a high signal indicating that the voltage 420 is greater than the threshold.

The voltage regulator 410 may be configured to selectively output a voltage 430 to the circuitry 415. For example, when the voltage regulator 410 is enabled, the voltage regulator 410 may adjust the voltage 470 to generate the voltage 430. For example, the voltage 470 may be 1.8V and the voltage regulator 410 may adjust the voltage 470 to output the voltage 430 of 1.2 V. In another example when the voltage regulator 410 is not enabled, the voltage regulator 410 may not output the voltage 430 to the circuitry 415. In some cases, the voltage regulator 410 may be a low-dropout regulator.

The voltage regulator 410 may be enabled or disabled based on the output 425. For example, when the output 425 indicates that the voltage 420 is less than the threshold, the voltage regulator 410 may be enabled to output the voltage 430 to the circuitry 415. In another example, when the output 425 indicates that the voltage 420 is greater than the threshold, the voltage regulator 410 may not be enabled and may not output any voltage to the circuitry 415. Thus, when the voltage 465 is supplied to a memory system, the voltage regulator 410 may be disabled which may conserve power at the memory system.

The circuitry 415 may be configured to select, from the voltage 430 and the voltage 420, a voltage 435 to output to components of the memory system. The circuitry 415 may select the voltage 430 or the voltage 420 based on the output 425. For example, if the output 425 indicates that the voltage 420 fails to satisfy the threshold (e.g., the voltage 465 is not supplied to the memory system), the circuitry 415 may select the voltage 430. In another example, if the output 425 indicates that the voltage 420 satisfies the threshold (e.g., the voltage 465 is supplied to the memory system), the circuitry 415 may select the voltage 420. Thus, the circuitry 415 may output the voltage 435 based on whether the voltage 420 satisfies the threshold.

Figure 5:
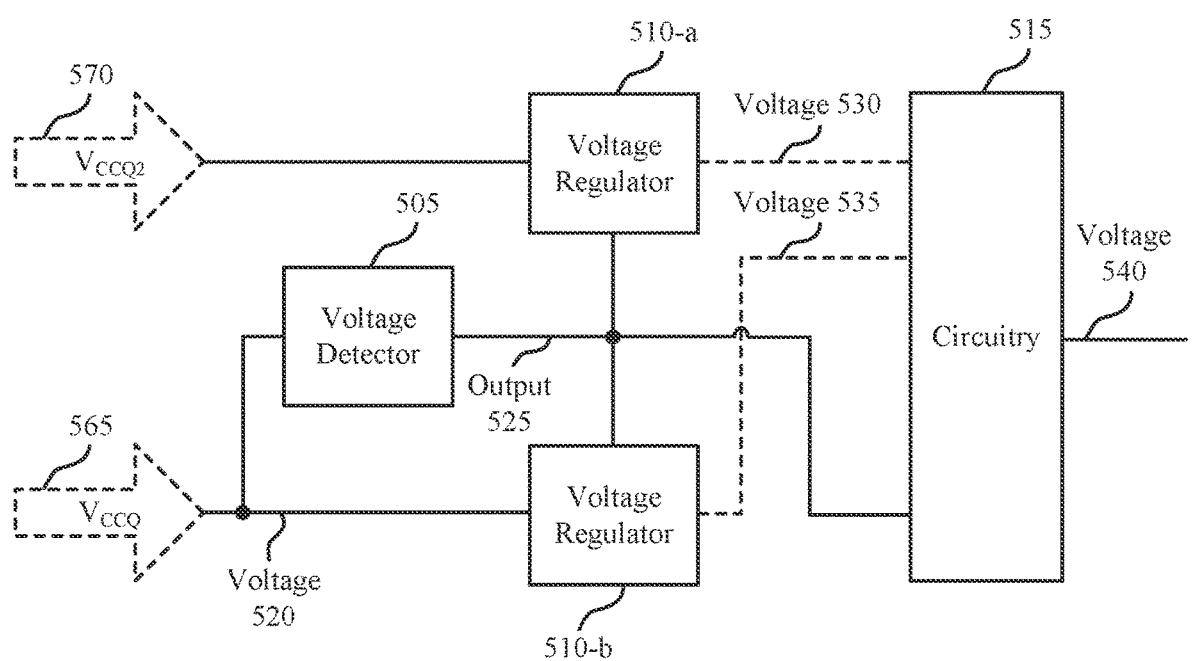

FIG. 5 illustrates an example of a circuit 500 that supports an improved power supply for a memory device in accordance with examples as disclosed herein. In some cases, the circuit 500 may include aspects of the circuit 275-b as described with reference to FIG. 2. For example, the voltage 565 may be an example of the voltage 265, and the voltage 570 may be an example of the voltage 270. Additionally, the circuit 500 may illustrate an output voltage 540, which may be supplied to logic circuitry 235 as described with reference to FIG. 2. The circuit 500 may additionally include a voltage detector 505, voltage regulators 510, and circuitry 515.

A memory system (e.g., as described with reference to FIGS. 1 and 2) may include circuit 500 in a case that memory system is configured to use a supply voltage equivalent to the voltage 565 (e.g., a $V_{CCQ}$ voltage, 1.2V) and in a case that the memory system is configured to use a supply voltage equivalent to the voltage 570 (e.g., a $V_{CCQ2}$ voltage, 1.8V). That is, the circuit 500 may detect which of the voltages 565 or 570 are supplied to the memory system by the host system and may adjust that voltage to output the voltage 540 to the logic circuitry 235.

The voltage 540 may be less than the voltage 565 and the voltage 570. Additionally, a power consumption associated with a voltage regulator 510 may be proportional to a magnitude of the voltage adjustment made by the voltage regulator 510. For example, if a voltage regulator 510 decreases an input voltage by 50% to output a voltage, the voltage regulator 510 may consume more power than if the voltage regulator 510 decreases the input voltage by less than 50% to output the voltage. Thus, adjusting one of the voltages 565 or 570 may consume less power than adjusting another supply voltage (e.g., supply voltage 260 as described with reference to FIG. 2 that is greater than the supply voltages 565 and 570).

The circuit 500 may include a voltage detector 505 coupled with a pin that is configured to receive the voltage 565 (e.g., from a host system). The voltage detector 505 may detect whether the voltage 520 of the pin exceeds a threshold. For example, the voltage detector 505 may compare a voltage 520 of the pin to a threshold voltage that is less than the voltage 565. In a case that the host system does not supply the voltage 565 to the memory system, the voltage detector 505 may determine that the voltage 520 of the pin is less than the threshold and may generate an output 525 indicating that the voltage 520 is less than the threshold. For example, the voltage detector 505 may output a low signal indicating that the voltage 520 is less than the threshold. In another case where the host system does supply the voltage 565 to the memory system, the voltage detector 505 may determine that the voltage 520 of the pin is greater than the threshold and may generate an output 525 indicating that the voltage 520 is greater than the threshold. For example, the voltage detector 505 may output a high signal indicating that the voltage 520 is greater than the threshold.

The voltage regulator 510-*a* may be configured to selectively output a voltage 530 to the circuitry 515. For example, when the voltage regulator 510-*a* is enabled, the voltage regulator 510-*a* may adjust the voltage 570 to generate the voltage 530. For example, the voltage 570 may be 1.8V and the voltage regulator 510-*a* may adjust the voltage 570 to output the voltage 530 that is less than the voltage 570. In another example when the voltage regulator 510-*a* is not enabled, the voltage regulator 510-*a* may not output the voltage 530 to the circuitry 515. In some cases, the voltage regulator 510-*a* may be a low-dropout regulator.

The voltage regulator 510-*a* may be enabled or disabled based on the output 525. For example, when the output 525 indicates that the voltage 520 is less than the threshold, the voltage regulator 510-*a* may be enabled to output the voltage 530 to the circuitry 515. In another example, when the output 525 indicates that the voltage 520 is greater than the threshold, the voltage regulator 510-*a* may not be enabled and may not output any voltage to the circuitry 515. Thus, when the voltage 565 is supplied to a memory system, the voltage regulator 510-*a* may be disabled which may conserve power at the memory system.

The voltage regulator 510-*b* may be configured to selectively output a voltage 535 to the circuitry 515. For example, when the voltage regulator 510-*b* is enabled, the voltage regulator 510-*b* may adjust the voltage 565 to generate the voltage 535. For example, the voltage 565 may be 1.2V and the voltage regulator 510-*b* may adjust the voltage 565 to output the voltage 535 that is less than the voltage 565. In another example when the voltage regulator 510-*b* is not enabled, the voltage regulator 510-*b* may not output the voltage 535 to the circuitry 515. In some cases, the voltage regulator 510-*b* may be a low-dropout regulator.

The voltage regulator 510-*b* may be enabled or disabled based on the output 525. For example, when the output 525 indicates that the voltage 520 is greater than the threshold, the voltage regulator 510-*b* may be enabled to output the voltage 535 to the circuitry 515. In another example, when the output 525 indicates that the voltage 520 is less than the threshold, the voltage regulator 510-*b* may not be enabled and may not output any voltage to the circuitry 515. Thus, when the voltage 565 is not supplied to a memory system, the voltage regulator 510-*b* may be disabled which may conserve power at the memory system.

The circuitry 515 may be configured to select, from the voltage 530 and the voltage 535, a voltage 540 to output to components of the memory system. The circuitry 515 may select the voltage 530 or the voltage 535 based on the output 525. For example, if the output 525 indicates that the voltage 520 fails to satisfy the threshold (e.g., the voltage 565 is not supplied to the memory system), the circuitry 515 may select the voltage 530. In another example, if the output 525 indicates that the voltage 520 satisfies the threshold (e.g., the voltage 565 is supplied to the memory system), the circuitry 515 may select the voltage 535.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory device, a voltage detector configured to detect whether a first voltage of a first pin of the apparatus satisfies a threshold and to generate an output that indicates whether the first voltage of the first pin of the apparatus satisfies the threshold, a voltage regulator coupled with the voltage detector and configured to selectively output a second voltage, where whether the voltage regulator outputs the second voltage is based on the output of the voltage detector, and circuitry coupled with the voltage detector and the voltage regulator, where the circuitry is configured to output a supply voltage to the memory device and to select the supply voltage from among the first voltage and the second voltage based on the output of the voltage detector.

In some examples, the voltage regulator may be configured to be selectively enabled based on the output of the voltage detector, and the voltage regulator may be configured to output the second voltage based on being enabled.

In some cases, the voltage regulator may be configured to be enabled when the output of the voltage detector indicates that the first voltage of the first pin fails to satisfy the threshold, and the voltage regulator may be configured to be disabled when the output of the voltage detector indicates that the first voltage of the first pin satisfies the threshold.

Some instances of the apparatus may include a second pin coupled with the voltage regulator, the second pin configured to supply a third voltage to the voltage regulator different from the second voltage, where the voltage regulator may be configured to output the second voltage based on the third voltage being supplied.

In some examples, the circuitry may be configured to select the first voltage as the supply voltage when the output of the voltage detector indicates that the first voltage of the first pin satisfies the threshold, and the circuitry may be configured to select the second voltage as the supply voltage when the output of the voltage detector indicates that the first voltage of the first pin fails to satisfy the threshold.

In some cases, the voltage detector may be configured to supply the output that indicates whether the first voltage satisfies the threshold to the voltage regulator and to the circuitry.

In some instances, the circuitry may be further coupled with the first pin of the apparatus, and the circuitry may be further configured to receive the first voltage from the first pin of the apparatus.

In some examples, the circuitry may be configured to output the supply voltage to an input/output component of the memory device for communicating with a controller of the memory device, an input/output component of the controller for communicating with the memory device, or an input/output component of the controller for communicating with a host device (e.g., a host system) of the memory device, or any combination thereof.

In some cases, the voltage regulator may be a low-dropout regulator.

An apparatus is described. The apparatus may include a memory device, a controller of the memory device, the controller coupled with the memory device, and a voltage detector configured to detect whether a first voltage of a first pin of the apparatus satisfies a threshold and to generate an output that indicates whether the first voltage of the first pin of the apparatus satisfies the threshold. The apparatus may additionally include a first voltage regulator coupled with the voltage detector and the first pin of the apparatus, where the first voltage regulator configured to selectively output a second voltage, where whether the first voltage regulator outputs the second voltage is based on the output of the voltage detector, and a second voltage regulator coupled with the voltage detector and configured to selectively output the second voltage, where whether the second voltage regulator outputs the second voltage is based on the output of the voltage detector. The apparatus may also include circuitry coupled with the voltage detector, the first voltage regulator, and the second voltage regulator, where the circuitry is configured to output, to the controller, the second voltage as output by a selected voltage regulator and to select the selected voltage regulator from among the first voltage regulator and the second voltage regulator based on the output of the voltage detector.

Some examples of the apparatus may include a second pin coupled with the second voltage regulator, the second pin configured to supply, to the second voltage regulator, a third voltage different from the first voltage and the second voltage, where the second voltage regulator may be configured to selectively output the second voltage based on the third voltage being supplied.

In some cases, the first voltage regulator may be configured to be selectively enabled based on the output of the voltage detector, and the first voltage regulator may be configured to output the second voltage based on being enabled.

In some instances, the first voltage regulator may be configured to be enabled when the output of the voltage detector indicates that the first voltage of the first pin satisfies the threshold, and the first voltage regulator may be configured to be disabled when the output of the voltage detector indicates that the first voltage of the first pin fails to satisfy the threshold.

In some examples, the second voltage regulator may be configured to be selectively enabled based on the output of the voltage detector, and the second voltage regulator may be configured to output the second voltage based on being enabled.

In some cases, the second voltage regulator may be configured to be enabled when the output of the voltage detector indicates that the first voltage of the first pin fails to satisfy the threshold, and the second voltage regulator may be configured to be disabled when the output of the voltage detector indicates that the first voltage of the first pin satisfies the threshold.

In some instances, the circuitry may be configured to select the first voltage regulator when the output of the voltage detector indicates that the first voltage of the first pin satisfies the threshold, and the circuitry may be configured to select the second voltage regulator when the output of the voltage detector indicates that the first voltage of the first pin fails to satisfy the threshold.

In some examples, the voltage detector may be configured to supply the output that indicates whether the first voltage satisfies the threshold to the first voltage regulator, to the second voltage regulator, and to the circuitry.

In some cases, the circuitry may be configured to output the second voltage to logic circuitry within the controller.

In some instances, the first voltage regulator or the second voltage regulator may be a low-dropout regulator.

An apparatus is described. The apparatus may include a controller configured to be coupled with a host device (e.g., a host system), a memory device coupled with the controller, a first circuit coupled with the memory device, and a second circuit coupled with the controller. The first circuit may include a first voltage detector configured to detect whether a first voltage of a first pin of the apparatus satisfies a first threshold and to generate an output that indicates whether the first voltage of the first pin of the apparatus satisfies the first threshold, and first circuitry coupled with the first voltage detector and configured to output a supply voltage to the memory device and to select the supply voltage from among the first voltage and a second voltage based on the output of the first voltage detector. The second circuit may include a second voltage detector configured to detect whether a third voltage of a second pin of the apparatus satisfies a second threshold and generate an output that indicates whether the third voltage of the second pin of the apparatus satisfies the second threshold, and second circuitry coupled with the second voltage detector and configured to output, to the controller, a fourth voltage output by a selected voltage regulator and to select the selected voltage regulator from among the first voltage regulator and the second voltage regulator based on the output of the second voltage detector.

In some examples, the first circuit further may include a third voltage regulator coupled with the first voltage detector, the third voltage regulator configured to selectively output the second voltage to the first circuitry, where whether the third voltage regulator outputs the second voltage may be based on the output of the first voltage detector.

In some cases, the first voltage regulator may be coupled with the second voltage detector and the second pin of the apparatus, the first voltage regulator may be configured to selectively output the fourth voltage to the second circuitry, where whether the first voltage regulator outputs the fourth voltage may be based on the output of the second voltage detector, the second voltage regulator may be coupled with the second voltage detector, and the second voltage regulator may be configured to selectively output the fourth voltage to the second circuitry, where whether the second voltage regulator outputs the fourth voltage may be based on the output of the second voltage detector.

In some instances, the first pin and the second pin may be the same, and the first voltage and the third voltage may be the same.

In some examples, the first circuitry may be configured to output the supply voltage to an I/O component of the memory device for communicating with the controller, an I/O component of the controller for communicating with the memory device, or an I/O component of the controller for communicating with a host device of the memory device, or any combination thereof.

In some cases, the second circuitry may be configured to output the fourth voltage to logic circuitry within the controller.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

Also, as used herein, including in the claims. "or" as used in a list of items (for example, a list of items prefaced by a phrase such as "at least one of" or "one or more of") indicates an inclusive list such that, for example, a list of at least one of A, B. or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
 a memory device;
 a voltage detector configured to detect whether a first voltage of a first pin of the apparatus satisfies a threshold and to generate an output that indicates whether the first voltage of the first pin of the apparatus satisfies the threshold;
 a voltage regulator coupled with the voltage detector and configured to selectively output a second voltage, wherein whether the voltage regulator outputs the second voltage is based at least in part on the output of the voltage detector;
 a second pin coupled with the voltage regulator, the second pin configured to supply a third voltage to the voltage regulator different from the second voltage, wherein the voltage regulator is configured to output the second voltage based at least in part on the third voltage being supplied; and
 circuitry coupled with the voltage detector and the voltage regulator, wherein the circuitry is configured to output a supply voltage to the memory device and to select the supply voltage from among the first voltage and the second voltage based at least in part on the output of the voltage detector.

2. The apparatus of claim 1, wherein:
 the voltage regulator is configured to be selectively enabled based at least in part on the output of the voltage detector; and
 the voltage regulator is configured to output the second voltage based at least in part on being enabled.

3. The apparatus of claim 2, wherein:
 the voltage regulator is configured to be enabled when the output of the voltage detector indicates that the first voltage of the first pin fails to satisfy the threshold; and
 the voltage regulator is configured to be disabled when the output of the voltage detector indicates that the first voltage of the first pin satisfies the threshold.

4. The apparatus of claim 1, wherein:
 the circuitry is configured to select the first voltage as the supply voltage when the output of the voltage detector indicates that the first voltage of the first pin satisfies the threshold; and
 the circuitry is configured to select the second voltage as the supply voltage when the output of the voltage detector indicates that the first voltage of the first pin fails to satisfy the threshold.

5. The apparatus of claim 1, wherein the voltage detector is configured to supply the output that indicates whether the first voltage satisfies the threshold to the voltage regulator and to the circuitry.

6. The apparatus of claim 1, wherein:
 the circuitry is further coupled with the first pin of the apparatus; and
 the circuitry is further configured to receive the first voltage from the first pin of the apparatus.

7. The apparatus of claim 1, wherein the circuitry is configured to output the supply voltage to an input/output component of the memory device for communicating with a controller of the memory device, an input/output component of the controller for communicating with the memory device, or an input/output component of the controller for communicating with a host device of the memory device, or any combination thereof.

8. The apparatus of claim 1, wherein the voltage regulator is a low-dropout regulator.

9. An apparatus, comprising:
 a memory device;
 controller of the memory device, the controller coupled with the memory device;
 a voltage detector configured to detect whether a first voltage of a first pin of the apparatus satisfies a threshold and to generate an output that indicates whether the first voltage of the first pin of the apparatus satisfies the threshold;
 a first voltage regulator coupled with the voltage detector and the first pin of the apparatus, wherein the first voltage regulator configured to selectively output a second voltage, wherein whether the first voltage regulator outputs the second voltage is based at least in part on the output of the voltage detector;
 a second voltage regulator coupled with the voltage detector and configured to selectively output the second voltage, wherein whether the second voltage regulator outputs the second voltage is based at least in part on the output of the voltage detector; and
 circuitry coupled with the voltage detector, the first voltage regulator, and the second voltage regulator, wherein the circuitry is configured to output, to the controller, the second voltage as output by a selected voltage regulator and to select the selected voltage regulator from among the first voltage regulator and the second voltage regulator based at least in part on the output of the voltage detector.

10. The apparatus of claim 9, further comprising:
a second pin coupled with the second voltage regulator, the second pin configured to supply, to the second voltage regulator, a third voltage different from the first voltage and the second voltage, wherein the second voltage regulator is configured to selectively output the second voltage based at least in part on the third voltage being supplied.

11. The apparatus of claim 9, wherein:
the first voltage regulator is configured to be selectively enabled based at least in part on the output of the voltage detector; and
the first voltage regulator is configured to output the second voltage based at least in part on being enabled.

12. The apparatus of claim 11, wherein:
the first voltage regulator is configured to be enabled when the output of the voltage detector indicates that the first voltage of the first pin satisfies the threshold; and
the first voltage regulator is configured to be disabled when the output of the voltage detector indicates that the first voltage of the first pin fails to satisfy the threshold.

13. The apparatus of claim 9, wherein:
the second voltage regulator is configured to be selectively enabled based at least in part on the output of the voltage detector; and
the second voltage regulator is configured to output the second voltage based at least in part on being enabled.

14. The apparatus of claim 13, wherein:
the second voltage regulator is configured to be enabled when the output of the voltage detector indicates that the first voltage of the first pin fails to satisfy the threshold; and
the second voltage regulator is configured to be disabled when the output of the voltage detector indicates that the first voltage of the first pin satisfies the threshold.

15. The apparatus of claim 9, wherein:
the circuitry is configured to select the first voltage regulator when the output of the voltage detector indicates that the first voltage of the first pin satisfies the threshold; and
the circuitry is configured to select the second voltage regulator when the output of the voltage detector indicates that the first voltage of the first pin fails to satisfy the threshold.

16. The apparatus of claim 9, wherein the voltage detector is configured to supply the output that indicates whether the first voltage satisfies the threshold to the first voltage regulator, to the second voltage regulator, and to the circuitry.

17. The apparatus of claim 9, wherein the circuitry is configured to output the second voltage to logic circuitry within the controller.

18. The apparatus of claim 9, wherein the first voltage regulator or the second voltage regulator is a low-dropout regulator.

19. An apparatus, comprising:
a controller configured to be coupled with a host device;
a memory device coupled with the controller;
a first circuit coupled with the memory device and comprising:
a first voltage detector configured to detect whether a first voltage of a first pin of the apparatus satisfies a first threshold and to generate an output that indicates whether the first voltage of the first pin of the apparatus satisfies the first threshold; and
first circuitry coupled with the first voltage detector and configured to output a supply voltage to the memory device and to select the supply voltage from among the first voltage and a second voltage based at least in part on the output of the first voltage detector; and
a second circuit coupled with the controller, a first voltage regulator, and a second voltage regulator, the second circuit comprising:
a second voltage detector configured to detect whether a third voltage of a second pin of the apparatus satisfies a second threshold and generate an output that indicates whether the third voltage of the second pin of the apparatus satisfies the second threshold; and
second circuitry coupled with the second voltage detector and configured to output, to the controller, a fourth voltage output by a selected voltage regulator and to select the selected voltage regulator from among the first voltage regulator and the second voltage regulator based at least in part on the output of the second voltage detector.

20. The apparatus of claim 19, wherein the first circuit further comprises:
a third voltage regulator coupled with the first voltage detector, the third voltage regulator configured to selectively output the second voltage to the first circuitry, wherein whether the third voltage regulator outputs the second voltage is based at least in part on the output of the first voltage detector.

21. The apparatus of claim 19, wherein:
the first voltage regulator is coupled with the second voltage detector and the second pin of the apparatus;
the first voltage regulator is configured to selectively output the fourth voltage to the second circuitry, wherein whether the first voltage regulator outputs the fourth voltage is based at least in part on the output of the second voltage detector;
the second voltage regulator is coupled with the second voltage detector; and
the second voltage regulator is configured to selectively output the fourth voltage to the second circuitry, wherein whether the second voltage regulator outputs the fourth voltage is based at least in part on the output of the second voltage detector.

22. The apparatus of claim 19, wherein:
the first pin and the second pin are the same; and
the first voltage and the third voltage are the same.

23. The apparatus of claim 19, wherein the first circuitry is configured to output the supply voltage to an input/output component of the memory device for communicating with the controller, an input/output component of the controller for communicating with the memory device, or an input/output component of the controller for communicating with a host device of the memory device, or any combination thereof.

24. The apparatus of claim 19, wherein the second circuitry is configured to output the fourth voltage to logic circuitry within the controller.

* * * * *